US009319256B2

(12) United States Patent  
Park et al.

(10) Patent No.: US 9,319,256 B2  
(45) Date of Patent: Apr. 19, 2016

(54) OOK MODULATION DEVICE AND WIRELESS TRANSMITTING DEVICE INCLUDING THE SAME

(71) Applicant: KOREA ADVANCED INSTITUTE OF SCIENCE AND TECHNOLOGY, Daejeon (KR)

(72) Inventors: Chul Soon Park, Daejeon (KR); Chul Woo Byeon, Daejeon (KR); Chae Jun Lee, Daejeon (KR); Chong Hyun Yoon, Daejeon (KR); Joong Ho Lee, Daejeon (KR); Seong Jun Cho, Daejeon (KR); Hong Yi Kim, Daejeon (KR); In Sang Song, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 14/438,174

(22) PCT Filed: Sep. 6, 2013

(86) PCT No.: PCT/KR2013/008065  
§ 371 (c)(1),  
(2) Date: Apr. 23, 2015

(87) PCT Pub. No.: WO2014/069782  
PCT Pub. Date: May 8, 2014

(65) Prior Publication Data  
US 2015/0256369 A1  Sep. 10, 2015

(30) Foreign Application Priority Data

Nov. 1, 2012  (KR) ......................... 10-2012-0123008

(51) Int. Cl.  
*H03C 3/00* (2006.01)  
*H04L 27/04* (2006.01)  
*H04L 27/152* (2006.01)  
*H04L 27/156* (2006.01)

(Continued)

(52) U.S. Cl.  
CPC ................ *H04L 27/04* (2013.01); *H03B 5/124* (2013.01); *H03B 5/1212* (2013.01);  
(Continued)

(58) Field of Classification Search  
CPC . H04L 27/12; H04L 27/1563; H04L 27/1525; H04L 27/04; H03C 3/00; H03B 5/1228; H03B 5/1212; H03B 5/124; H03D 1/18; H03D 7/1441; H03K 7/02  
USPC .................. 329/300, 302, 303; 332/100, 101; 375/219, 303, 306  
See application file for complete search history.

(56) References Cited

U.S. PATENT DOCUMENTS 7,436,263 B2* 10/2008 Nguyen ............... H04L 27/0008  
329/300  
8,976,846 B2* 3/2015 Shimizu ................... H04L 5/06  
375/219

FOREIGN PATENT DOCUMENTS

KR  10-2012-0092634 A  8/2012  
WO  01-28121 A2  4/2001

OTHER PUBLICATIONS

Jeong, Moo-Il et al., "Design of a Transceiver RFIC for UWB Chaotic OOK System in 0.18um CMOS Technology", Proceeding of the 10th European Conference on Wireless Technology, Oct. 2007.

*Primary Examiner* — Arnold Kinkead  
(74) *Attorney, Agent, or Firm* — Womble Carlyle Sandridge & Rice LLP

(57) ABSTRACT

An OOK modulation device according to the present inventive concept includes: an oscillator outputting a first frequency signal in which the frequency varies according to an input voltage; a frequency multiplier switching unit operating according to an OOK input data and switching on/off a second frequency signal that is obtained by multiplying the first frequency signal; and a switching amplifying unit amplifying and switching the second frequency signal according to the OOK input data to output an OOK modulation signal.

8 Claims, 6 Drawing Sheets

(51) Int. Cl.
*H04L 27/12* (2006.01)
*H03B 5/12* (2006.01)
*H03D 1/18* (2006.01)
*H03D 7/14* (2006.01)
*H03K 7/02* (2006.01)

(52) U.S. Cl.
CPC ............... *H03B 5/1228* (2013.01); *H03C 3/00* (2013.01); *H03D 1/18* (2013.01); *H03D 7/1441* (2013.01); *H03K 7/02* (2013.01); *H04L 27/12* (2013.01); *H04L 27/1525* (2013.01); *H04L 27/1563* (2013.01)

OOK MODULATION DEVICE AND WIRELESS TRANSMITTING DEVICE INCLUDING THE SAME

FIELD OF INVENTION

Example embodiments generally relate to an on-off keying (OOK) modulation device with a low power consumption and a high on/off isolation characteristic, and more particularly relate to an OOK modulation device which includes an oscillator outputting a low frequency signal and a frequency multiplier switching unit performing switching operation and frequency multiplying operation. The OOK modulation device greatly reduces power consumption in an off state and has a high on/off isolation characteristic and a high output power characteristic when the OOK modulation device performs modulation operation.

BACKGROUND

Low power consumption is a major issue in an allocation using a mobile device because the mobile device has a limited power supply.

Many schemes have been suggested for reducing power consumption in a communication system, and a self heterodyne structure using OOK modulation as illustrated in FIG. 1 is suitable for being employed in a mobile device because the self heterodyne structure has a simplified system structure and does not need to include a phase-locked loop circuit which consumes great power, thereby greatly reducing overall power consumption of the system.

FIG. 1 illustrates a transmitter that includes a conventional Gbps high-speed OOK signal modulation device having a bandwidth with a millimeter wave, which can be employed in a general mobile device.

Referring to FIG. 1, a transmitter includes an OOK modulation device 100 and an antenna ANT. The OOK modulation device 100 receives a Gbps OOK data signal and modulates the OOK data signal to output the modulated OOK data signal to the antenna ANT. The antennal ANT transmits an output of the OOK modulation device 100.

The transmitter employing the self heterodyne structure using OOK modulation also transmits a local carrier signal having a frequency of 60 GHz along with the modulated OOK data signal such that a receiver may demodulate the modulated OOK data signal. The OOK modulation device 100 in the transmitter, instead of a general power amplifier, is in conducting state (on state) and transmits the modulated OOK data signal through the antennal ANT when the OOK data signal corresponds to '1', and is in a non-conducting state (off state) and transmits not signal when the OOK data signal corresponds to '0'.

The On/off isolation characteristic of the OOK modulation device in response to the on state and off state of OOK input data, the transmission gain of a signal having an on state, power consumption and the data processing speed are important articles when designing an OOK modulation device.

Conventional OOK modulation devices have disadvantages such as low signal transmission gain and a signal leakage due to frequency characteristic and these disadvantages become worse when OOK modulation devices are fabricated using complementary metal oxide semiconductor (CMOS) process for low cost and low power consumption.

Due to these reasons, there is a need for an OOK modulation device having a high on/off isolation characteristic and data processing speed greater than a Gbps value in a millimeter wave range that has a large signal loss and a large signal leakage.

Korean Patent Publication No. 10-2012-0038275 published on Apr. 23, 2012, discloses an OOK modulation device that outputs a high-power level OOK modulation signal. The OOK modulation device includes a plurality of amplifiers and one amplifier operates as a common source amplifier in response to an amplified signal of another amplifier. The OOK modulation device includes an oscillator that generates an carrier wave having a high frequency. Due to the high frequency, the oscillator consumes great power and the OOK modulation device must include an additional circuitry such as a buffer.

CONTENT OF THE INVENTIVE CONCEPT

Technical Object of the Inventive Concept

Some example embodiments of the inventive concept provide an OOK modulation device capable of reducing power consumption and enhancing on/off isolation characteristic.

Some example embodiments of the inventive concept provide an OOK modulation method capable of reducing power consumption and enhancing on/off isolation characteristic.

Means for Achieving the Technical Object

According to example embodiments, an on-off keying (OOK) modulation device includes an oscillator, a frequency multiplier switching unit and a switching amplifying unit. The oscillator outputs a first frequency signal having a frequency varying in response to an input voltage. The frequency multiplier switching unit operates according to an OOK input data and on/off switches a second frequency signal that is obtained by multiplying the first frequency signal. The switching amplifying unit amplifies and switches the second frequency signal according to the OOK input data to output an OOK modulation signal.

According to example embodiments, a method of modulating on-off keying (OOK) input data using an OOK modulation device, wherein the OOK modulation device comprises an oscillator, a frequency multiplier switching unit operating the OOK input data and a switching amplifying unit, includes (1) outputting, in the oscillator, a first frequency signal having a frequency varying in response to an input voltage, (2) on/off switching, in the frequency multiplier switching unit, a second frequency signal that is obtained by multiplying the first frequency signal and (3) amplifying and switching, in the a switching amplifying unit, the second frequency signal according to the OOK input data to output an OOK modulation signal. The oscillator operates when the OOK input data is modulated. The frequency multiplier switching unit and the switching amplifying unit operate simultaneously according to on state and off state according to the OOK input data.

EFFECTS OF THE INVENTIVE CONCEPT

According to example embodiments, power consumption may be greatly reduced and the on/off isolation characteristic may be enhanced by more than 15 dB. In addition, the OOK modulation device may generate a high power signal without including additional amplifier and an up-converter mixer.

BRIEF DESCRIPTION OF THE DRAWINGS

Example embodiments of the inventive concept will be more clearly understood from the following detailed description taken in conjunction with the accompanying drawings.

PARTICULAR CONTENTS FOR IMPLEMENTING THE INVENTIVE CONCEPT

Various example embodiments will be described more fully hereinafter with reference to the accompanying drawings, in which some example embodiments are shown. In describing principles of example embodiments, the detailed description of the well-known function and configuration may be omitted if such description may bur the inventive concept.

Figure 1:
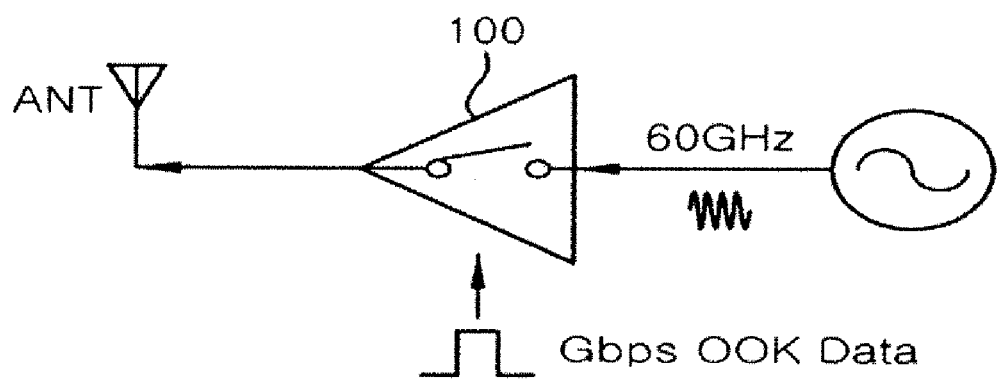
FIG. 1 illustrates a transmitter that includes a conventional Gbps high-speed OOK signal modulation device having a bandwidth with a millimeter wave, which can be employed in a general mobile device.
Figure 2:
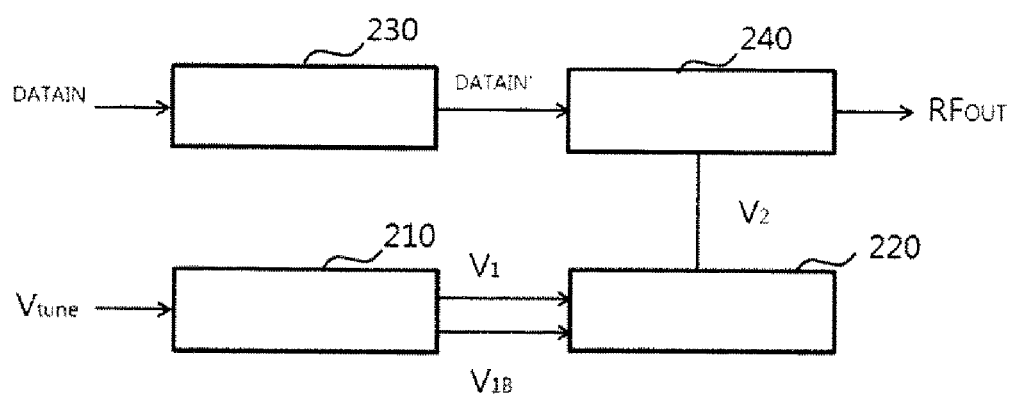
FIG. 2 is a block diagram illustrating an OOK modulation device according to example embodiments.

FIG. 2 is a block diagram illustrating an OOK modulation device according to example embodiments.

Referring to FIG. 2, an OOK modulation device includes an oscillator 210, a frequency multiplier switching unit 220, a digital data conversion unit 230 and a switching amplifying unit 240.

When the OOK modulation device of FIG. 2 performs modulation operation, the frequency multiplier switching unit 220 operates to multiply a first frequency signal V1 of the oscillator 210 to output a second frequency signal V2 and the switching amplifying unit 240 modulates OOK input data DATAIN in an on state. In an off state, the frequency multiplier switching unit 220 and the switching amplifying unit 240 do not operate and the switching amplifying unit 240 provides a substantial zero output. Therefore, the OOK modulation device of FIG. 2 outputs a digital 'one' in on state and outputs a digital 'zero' in off state. Accordingly, the OOK modulation device of FIG. 2 may greatly enhance an on/off isolation characteristic that is output power difference between the on state and the off state and may increase output power.

The oscillator 210 outputs the first frequency signal V1 whose frequency is varied in response to a input voltage Vtune. The oscillator 210 may be a voltage-controlled oscillator and may output the first frequency signal of 30 GHz in response to the a input voltage Vtune of 1V and may output the first frequency signal of 29 GHz in response to the a input voltage Vtune of 0.7V.

An oscillator outputting a lower frequency has may advantages over an oscillator outputting a higher frequency. As the frequency output from the oscillator becomes lower, a transconductance, an inductance and a quality factor of the oscillator become higher, output voltage of the oscillator core has a greater swing range, and the oscillator may be connected to another circuitry without a buffer. Therefore, the oscillator outputting a lower frequency may have a great output characteristic while consuming a less power. In the OOK modulation device of FIG. 2, the oscillator 210 generates the first frequency signal V1 having a lower frequency, and the frequency multiplier switching unit 220 having a switching function multiplies the first frequency signal V1 to generate the second frequency signal V2 whose frequency is higher than the frequency of the first frequency signal V1. Therefore, the OOK modulation device of FIG. 2 may have advantages of an oscillator generating a lower frequency and may have a high on/off isolation characteristic because the frequency multiplier switching unit 220 does not operate in an off state.

The frequency multiplier switching unit 220 multiplies a frequency of the first frequency signal V1 by a multiple of positive integers and on/off switches according to an on/off level of the OOK input data DATAIN to output the second frequency signal V2. Since the frequency multiplier switching unit 220 outputs a substantial zero signal when the OOK input data DATAIN is in an off state, the power consumption may be reduced. The frequency multiplier switching unit 220 is a frequency multiplier connecting the oscillator 210 and the switching amplifying unit 240 and also performs a switching operation according to the on/off level of the OOK input data DATAIN.

Figure 3:
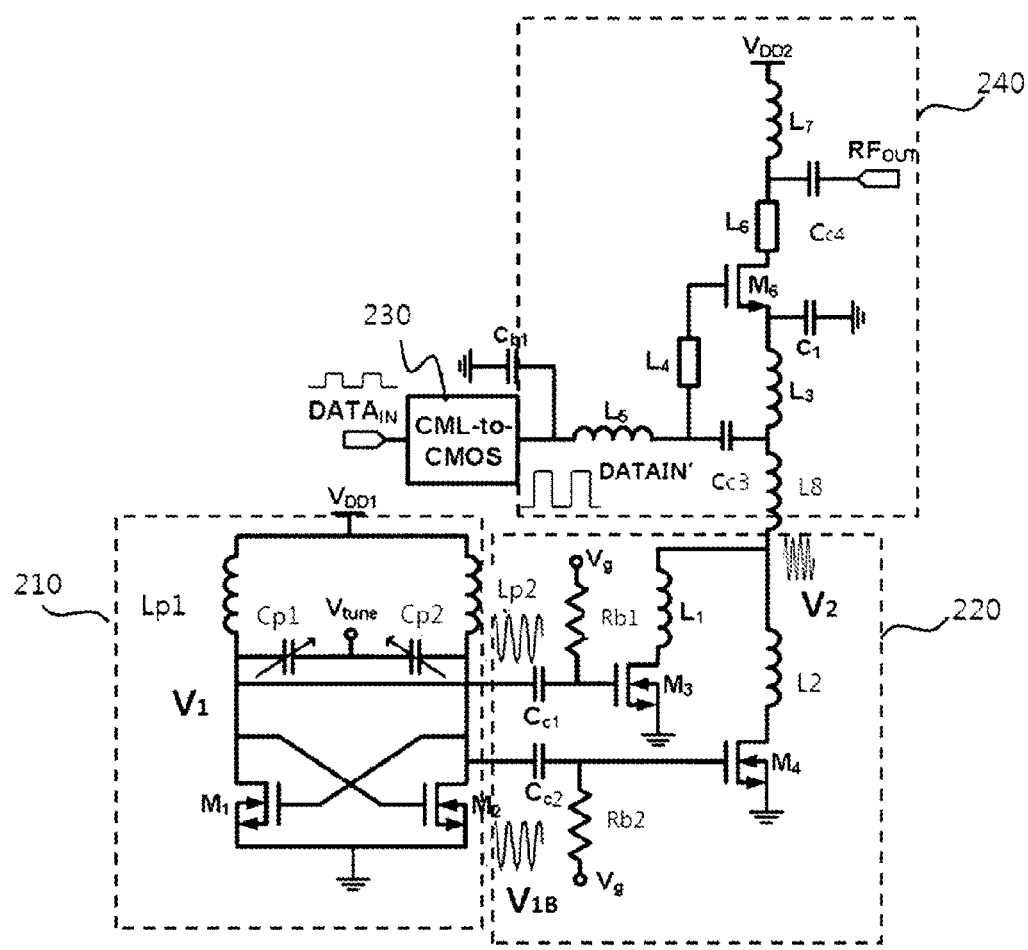
FIG. 3 is a circuit diagram illustrating the OOK modulation device of FIG. 2 according to example embodiments.

Referring to FIG. 3, the frequency multiplier switching unit 220 is connected to the switching amplifying unit 240, and outputs a frequency-multiplied signal when the OOK input data DATAIN is in an on state or outputs a substantial zero signal when the OOK input data DATAIN is in an off state.

The digital data conversion unit 230 converts a level (an amplitude) of the OOK input data DATAIN to provide a level-converted OOK input data DATAIN' to the switching amplifying unit 240. The digital data conversion unit 230 may be a current mode logic (CML) to a complementary metal oxide semiconductor (CMOS) converter that converts a CML level of the OOK input data DATAIN to a CMOS level. In general, a signal used in a high-speed input/out interface such as a clock signal swings in a CML level. The CML level has an average level determined based on an expected level and toggles, a signal swinging in the CML level has an expected swing amplitude. The signal having the CML level is not used in a device that determines a logic level of data based on a voltage level because the signal having the CML level has a relatively small swing range. The device that determines a logic level of data based on a voltage level uses a signal swinging in a CMOS level. Since the signal swinging in the CMOS level has a full swing range from a ground to a power supply voltage, the signal having the CMOS level has a relatively great swing range. The CML to CMOS level converter 230 converts a differential signal to a single-ended signal.

The OOK input data DATAIN may be 10 Gbps digital data. The OOK input data DATAIN may include information to be transmitted by the OOK modulation device.

The switching amplifying unit 240 amplifies the second frequency signal V2 according to a level of the level-converted OOK input data DATAIN' to output an OOK modulation signal RFout. The switching amplifying unit 240, in addition to amplifying operation, performs a switching operation according to the information in the OOK input data DATAIN. Therefore, the switching amplifying unit 240 amplifies the second frequency signal V2 and outputs the OOK modulation signal RFout in an on state, or outputs a substantial zero signal in an off state.

In the conventional OOK modulation device, since the oscillator outputs a signal of 60 GHz, the conventional OOK modulation device consumes greater power. However, in the OOK modulation device according to example embodiments, the oscillator 210 operates to output the first frequency signal V1 of 30 GHz in an off state and the frequency multiplier switching unit 220 and the switching amplifying unit 240 consume little power, and thus the power consumption may be greatly reduced.

FIG. 3 is a circuit diagram illustrating the OOK modulation device of FIG. 2 according to example embodiments.

Referring to FIG. 3, the oscillator 210 includes first and second transistors M1 and M2 that have gates and drains cross-coupled to each other, a ninth inductor Lp1, a tenth inductor Lp2, a first variable capacitor Cp1 and a second variable capacitor Cp2. The first and second transistors M1 and M2 have sources coupled to the ground. The ninth inductor Lp1 has a first terminal receiving a first power supply voltage VDD1 and a second terminal coupled to the drain of the first transistor M1. The tenth inductor Lp2 has a first terminal receiving the first power supply voltage VDD1 and a second terminal coupled to the drain of the second transistor M2. The first variable capacitor Cp1 has a first terminal receiving the input voltage Vtune and a second terminal coupled to a second terminal of the ninth inductor Lp1. The second variable capacitor Cp2 has a first terminal receiving the input voltage Vtune and a second terminal coupled to a second terminal of the tenth inductor Lp2.

The frequency multiplier switching unit 220 includes a first coupling capacitor Cc1, a second coupling capacitor Cc2, a first resistor Rb1, a second resistor Rb2, a third transistor M3, a fourth transistor M4, a first inductor L1 and a second inductor L2.

The first coupling capacitor Cc1 has a first terminal receiving the first frequency signal V1. The second coupling capacitor Cc2 has a first terminal receiving an inverted version V1B of the first frequency signal V1. The first resistor Rb1 has a first terminal receiving a gate voltage Vg and a second terminal coupled to a second terminal of the first coupling capacitor Cc1. The gate voltage Vg is a constant direct-current (DC) voltage, for example 0.4V. The a second resistor Rb2 has a first terminal receiving that gate voltage Vg and a second terminal coupled to a second terminal of the second coupling capacitor Cc2. The third transistor M3 has a gate coupled to the second terminal of the first coupling capacitor Cc1 and a source coupled to a ground. The fourth transistor M4 has a gate coupled to the second terminal of the second coupling capacitor Cc2 and a source coupled to the ground. The first inductor L1 is coupled between a drain of the third transistor M3 and an output node at which the second frequency signal V2 is output. The second inductor L2 is coupled between a drain of the fourth transistor M4 and the output node.

The switching amplifying unit 240 includes a second capacitor Cb1, a fifth inductor L5, a fourth inductor L4, a third coupling capacitor Cc3, an eighth inductor L8, a third inductor L3, a sixth transistor M6, a first capacitor C1, a sixth inductor L6, a seventh inductor L7 and a fourth coupling capacitor CC4. The second capacitor Cb1 is coupled between an input node in which a level-converted OOK modulation data DATAIN' is input and the ground. The fifth inductor L5 has a first terminal coupled to the input node. The fourth inductor L4 has a first terminal coupled to a second terminal of the fifth inductor L5. The third coupling capacitor Cc3 has a first terminal coupled to the second terminal of the fifth inductor L5. The eighth inductor L8 is coupled between a second terminal of the third coupling capacitor CC3 and the output node. The third inductor has a first terminal coupled to the second terminal of the third coupling capacitor Cc3. The sixth transistor M6 has a gate coupled to a second terminal of the fourth inductor L4 and a source coupled to a second terminal of the third inductor L3. The first capacitor C1 is coupled between a source of the sixth transistor M6 and the ground. The sixth inductor L6 has a first terminal coupled to a drain of the sixth transistor M6. The seventh inductor L7 has a first terminal receiving a second power supply voltage VDD2 and a second terminal coupled to a second terminal of the sixth inductor L6. The fourth coupling capacitor Cc4 is coupled between the second terminal of the sixth inductor L6 and an output terminal of the switching amplifying unit 240.

Figure 4:
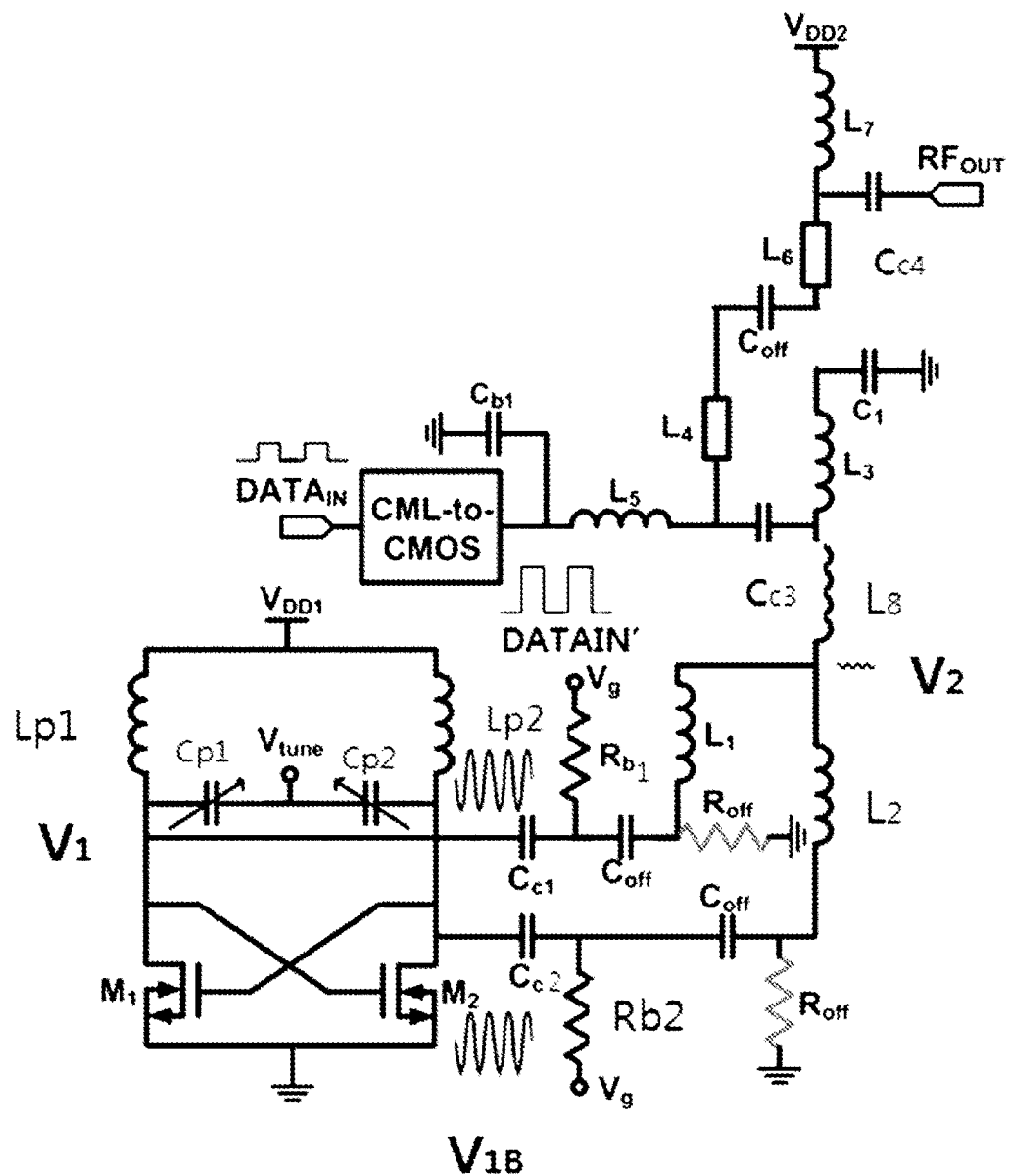
FIG. 4 illustrates an equivalent circuit of the OOK modulation device of FIG. 3 in an off state and associated signals.

FIG. 4 illustrates an equivalent circuit of the OOK modulation device of FIG. 3 in an off state and associated signals.

Referring to FIGS. 3 and 4, the oscillator 210 outputs the first frequency signal V1 in response to the input voltage Vtune of 1V through LC oscillation.

When the OOK input data DATAIN corresponds to '1', operation of the OOK modulation device in an on state will be described with reference to FIG. 3.

When the OOK input data DATAIN corresponds to '1', the third and fourth transistors M3 and M4 receive the first frequency signal V1 of 30 GHz, operate in non-linear region and multiply the frequency of the first frequency signal V1 by two times and output the second frequency signal V2 via the first and second inductors L1 and L2 at the output node of the frequency multiplier switching unit 220. When impedance matching performance is performed on second harmonics of the third and fourth transistors M3 and M4, the second harmonics may be output. The first frequency signal V1 is multiplied by two times through the first inductor L1 the inverted version V1B of the first frequency signal V1 is multiplied by two times through the second inductor L2, frequency-multiplied signals are added in the same phase and the second voltage signal V2 of 60 GHz is output from the frequency multiplier switching unit 220.

When the OOK input data DATAIN corresponds to '1', the sixth transistor M6 operates and the switching amplifying unit 240 amplifies the second frequency signal V2 to output the OOK modulations signal RFout when the level-converted OOK input data DATAIN'.

When the OOK input data DATAIN corresponds to '0', operation of the OOK modulation device in an on state will be described with reference to FIG. 4.

When the OOK input data DATAIN corresponds to '0', the switching amplifying unit 240 does not output a signal at the output terminal, the frequency multiplier switching unit 220 does not output a signal at the output node and the OOK modulation device operates in an off state. Therefore, a voltage at the output node of the frequency multiplier switching unit 220 is substantially zero and the third and fourth transistors M3 and M4 operate in a sub-threshold region. Accordingly, each of the third and fourth transistors M3 and M4 may serve as an off-state capacitor (Coff) and source and drain of the third and fourth transistors M3 and M4 may serve as off-state resistors (Roff). Since a resistance of the off-state resistor (Roff) is very small, most of the first frequency signal V1 provided from the first coupling capacitor Cc1 flows to an off-state resistor (an equivalent resistor of the third transistor in off-state) and a gate-source of the fourth transistor M4, very little portion of the first frequency signal V1 flows through the first inductor L1 and the frequency multiplier switching unit 220 outputs a substantial zero signal. In addition, when the OOK input data DATAIN corresponds to '0', the sixth transistor M6 also serves as an off-state capacitor, the (Coff) switching amplifying unit 240 outputs a substantial zero signal.

Therefore, the OOK modulation device may output the OOK modulation signal RFout by multiplying a frequency of the first frequency signal by tow times and amplifying the frequency-multiplied signal or may output a substantial zero signal according to on/off state of the OOK input data DATAIN. The transistors, the inductors and the capacitors consume no power except the oscillator 210 in the off state and the OOK modulation device may output the OOK modulation signal RFout having a great output power without including an amplifier in the on state.

Figure 5:
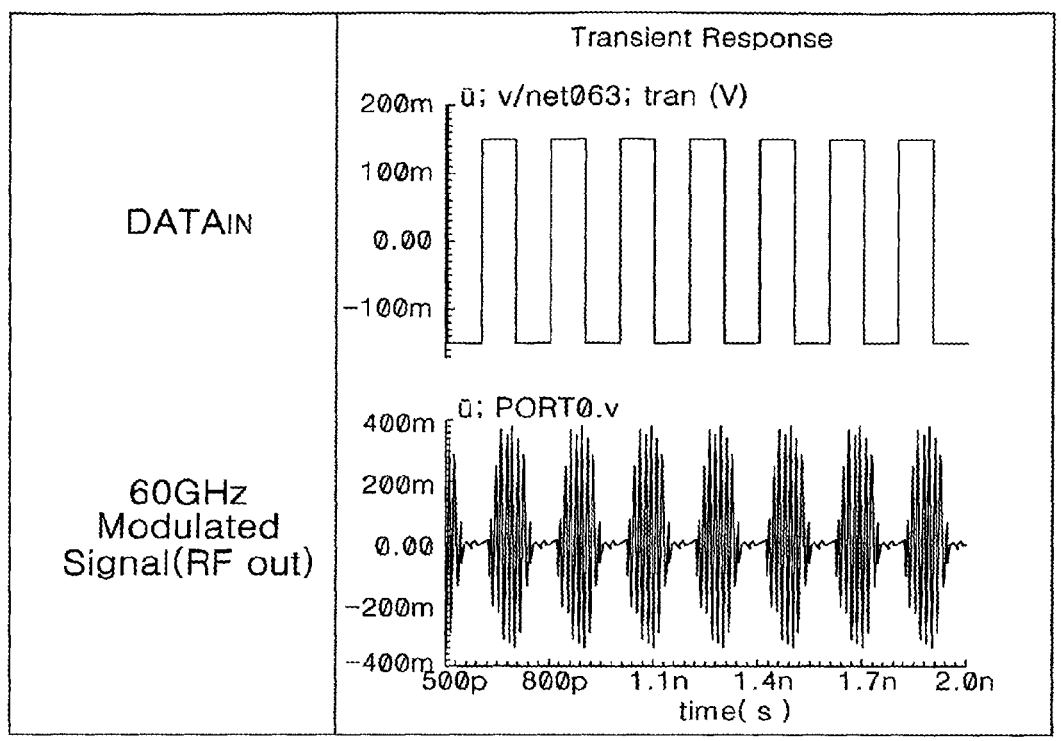
FIG. 5 illustrates waveforms of the 10 Gbps OOK input data and the OOK modulation signal in the OOK modulation device of FIG. 3.

FIG. 5 illustrates waveforms of the 10 Gbps OOK input data and the OOK modulation signal in the OOK modulation device of FIG. 3.

Referring to FIG. 5, when the OOK input data has a swing range of about 0.3V, the OOK modulation device outputs the OOK modulation signal RFout having a swing range of more than about 0.7V.

Figure 6:
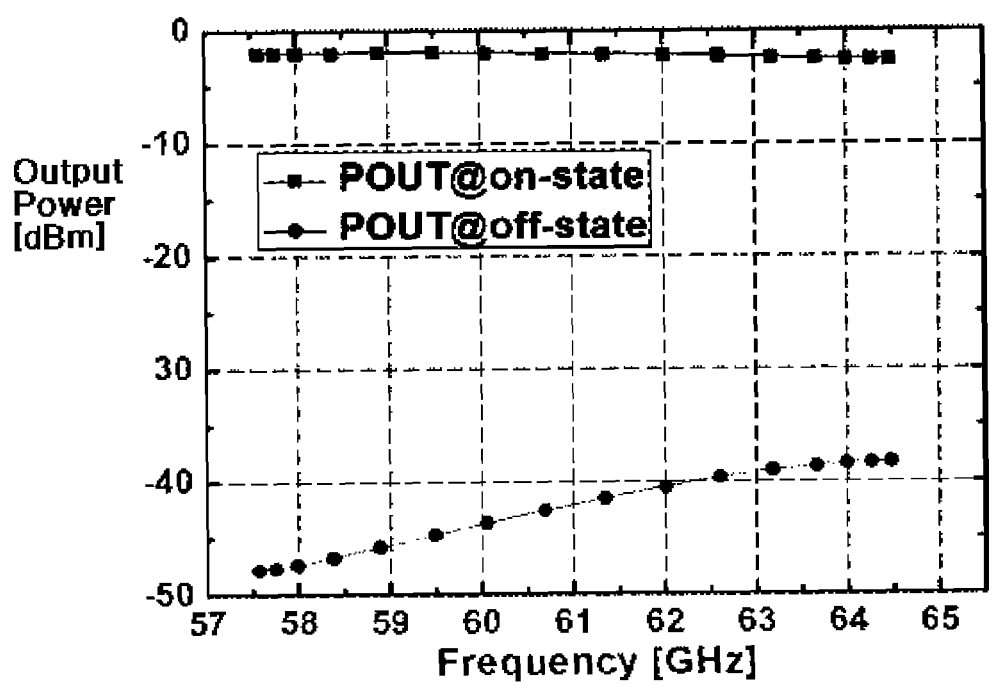
FIG. 6 illustrates a simulation result of an output power according to a frequency in the OOK modulation device of FIG. 3.
Figure 7:
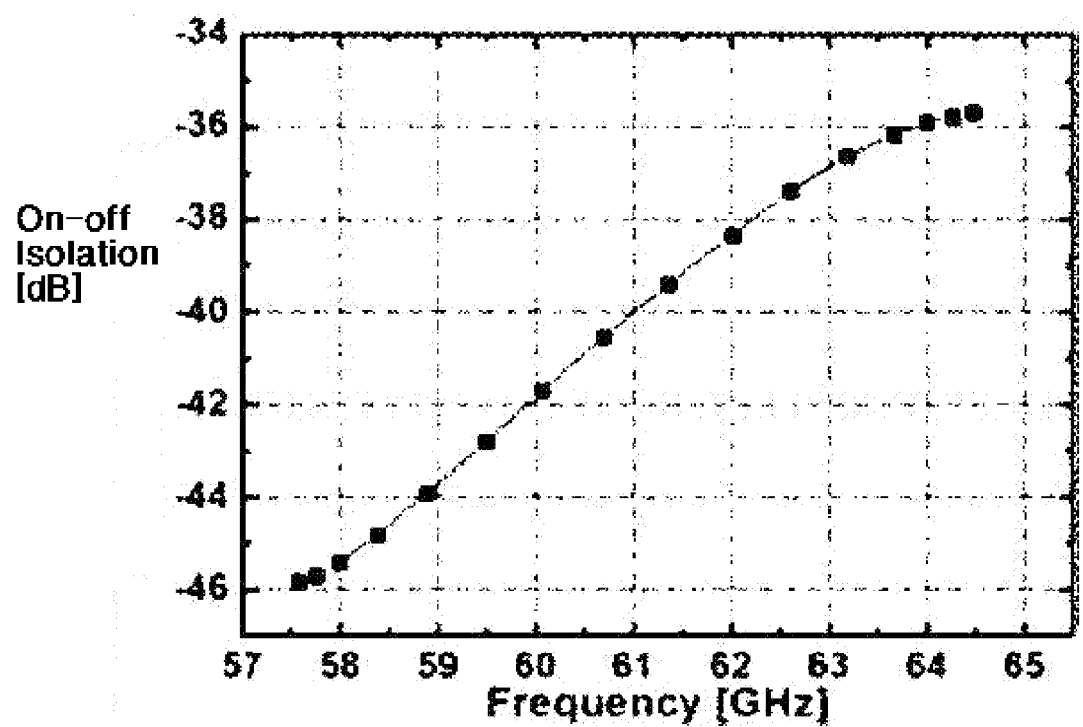
FIG. 7 illustrates a simulation result of an on-off isolation characteristic according to a frequency in the OOK modulation device of FIG. 3.

FIG. 6 illustrates a simulation result of an output power according to a frequency in the OOK modulation device of FIG. 3 and FIG. 7 illustrates a simulation result of an on-off isolation characteristic according to a frequency in the OOK modulation device of FIG. 3.

Referring to FIG. 6, the output power of the OOK modulations signal at 57.5-64.5 GHz is more than −4 dBm in the on state and is less than −35 dBm in the off state. In addition, referring to FIG. 7, the on-off isolation characteristic is −46~−36 dB at 57.5-64.5 GHz in spite of the on-off isolation characteristic decreasing when the frequency is increased, which is enhanced by more than 15 dB when compared with the on-off isolation characteristic of the conventional OOK modulation device.

The OOK modulation device according to example embodiments may be applicable to a transmitter by including an antenna that transmits the OOK modulation signal and also may be applicable to wireless personal area network (PAN) communication system operating at millimeter wave.

The OOK modulation device according to example embodiments improves the conventional OOK modulation device and greatly reduces power consumption. In addition, the OOK modulation device employs an oscillator generating a lower frequency to reduce power loss and greatly enhances on/off isolation characteristic because the frequency multiplier switching unit does not operate in an off state.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

ABILITY OF INDUSTRIAL UTILITY

The example embodiments may be applicable to wireless transmission device requiring a high efficiency because power consumption may be greatly reduced and the on/off isolation characteristic may be enhanced by more than 15 dB. In addition, the example embodiments may generate a high power signal without including additional amplifier and an up-converter mixer.

What is claimed is:

1. An on-off keying (OOK) modulation device comprising:
    an oscillator configured to output a first frequency signal having a frequency varying in response to an input voltage;
    a frequency multiplier switching unit that operates according to an OOK input data and on/off switches a second frequency signal that is obtained by multiplying the first frequency signal; and
    a switching amplifying unit configured to amplify and switch the second frequency signal according to the OOK input data to output an OOK modulation signal, wherein the frequency multiplier switching unit comprises:
    a first coupling capacitor that has a first terminal receiving the first frequency signal;
    a second coupling capacitor that has a first terminal receiving an inverted version of the first frequency signal;
    a first transistor that has a gate coupled to a second terminal of the first coupling capacitor and a source coupled to a ground; and
    a second transistor that has a gate coupled to a second terminal of the second coupling capacitor and a source coupled to the ground.

2. The OOK modulation device of claim 1, further comprising a digital data conversion unit that converts a level of the OOK input data to provide the level-converted OOK input data to the switching amplifying unit.

3. The OOK modulation device of claim 2, wherein the digital data conversion unit includes a current mode logic (CML) to a complementary metal oxide semiconductor (CMOS) converter that converts a CML level of the OOK input data to a CMOS level.

4. The OOK modulation device of claim 1, wherein the oscillator includes a voltage-controlled oscillator.

5. The OOK modulation device of claim 1, wherein the frequency multiplier switching unit further comprises:
    a first resistor that has a first terminal receiving a gate voltage and a second terminal coupled to the second terminal of the first coupling capacitor; and
    a second resistor that has a first terminal receiving that gate voltage and a second terminal coupled to the second terminal of the second coupling capacitor.

6. The OOK modulation device of claim 5, wherein the frequency multiplier switching unit further comprises:
    a first inductor coupled between a drain of the first transistor and an output node at which the second frequency signal is output; and
    a second inductor coupled between a drain of the second transistor and the output node.

7. The OOK modulation device of claim 1, wherein the switching amplifying unit comprises:
    a first capacitor coupled between an input node in which a level-converted OOK modulation data is input and a ground;
    a first inductor that has a first terminal coupled to the input node;
    a second inductor that has a first terminal coupled to a second terminal of the first inductor;
    a third coupling capacitor that has a first terminal coupled to the second terminal of the first inductor;
    a third inductor coupled between a second terminal of the third coupling capacitor and the output node;
    a fourth inductor that has a first terminal coupled to the second terminal of the third coupling capacitor;

a third transistor that has a gate coupled to a second terminal of the second inductor and a source coupled to a second terminal of the fourth inductor;

a second capacitor coupled between a source of the third transistor and the ground;

a fifth inductor that has a first terminal coupled to a drain of the third transistor;

a sixth inductor that has a first terminal receiving a second power supply voltage and a second terminal coupled to a second terminal of the fifth inductor; and a fourth coupling capacitor coupled between the second terminal of the fifth inductor and an output terminal of the switching amplifying unit.

8. The OOK modulation device of claim 1, wherein the oscillator comprises:

first and second transistors that have sources coupled to a ground gates and drains cross-coupled to each other;

a first inductor that has a first terminal receiving a first power supply voltage and a second terminal coupled to the drain of the first transistor;

a second inductor that has a first terminal receiving the first power supply voltage and a second terminal coupled to the drain of the second transistor;

a first variable capacitor that has a first terminal receiving the input voltage and a second terminal coupled to a second terminal of the first inductor; and a second variable capacitor that has a first terminal receiving the input voltage and a second terminal coupled to a second terminal of the second inductor.

* * * * *